(12) United States Patent
Wu et al.

(10) Patent No.: US 10,541,487 B2
(45) Date of Patent: Jan. 21, 2020

(54) CONNECTOR EQUIPPED WITH LOAD COVER CONTACTING CPU PERIPHERALLY

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Heng-Kang Wu, Shenzhen (CN); Fu-Jin Peng, Shenzhen (CN)

(73) Assignees: FOXCONN (KUNSHAN) COMPUTER CONNECTOR C, Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/258,700

(22) Filed: Jan. 28, 2019

(65) Prior Publication Data
US 2019/0245292 A1  Aug. 8, 2019

(30) Foreign Application Priority Data
Feb. 8, 2018  (CN) .......................... 2018 1 0127486

(51) Int. Cl.
*H01R 13/62* (2006.01)
*H01R 12/88* (2011.01)
*H01R 12/70* (2011.01)

(52) U.S. Cl.
CPC ......... *H01R 12/88* (2013.01); *H01R 12/7076* (2013.01)

(58) Field of Classification Search
CPC .. H05K 7/1053; H05K 7/1023; H05K 7/1038; H01R 13/193
USPC .................. 439/331, 73, 330, 342, 525, 526
See application file for complete search history.

(56) References Cited

U.S. PATENT DOCUMENTS

| | | | |
|---|---|---|---|
| 8,932,067 B2* | 1/2015 | Yeh ...................... | H05K 7/1053 439/68 |
| 9,089,526 B2* | 7/2015 | Tchernitchin ........ | A61K 36/185 |
| 9,118,141 B2* | 8/2015 | Yeh ...................... | H01R 13/533 |
| 9,192,070 B2* | 11/2015 | Tan ......................... | H05K 7/10 |

(Continued)

FOREIGN PATENT DOCUMENTS

| | | |
|---|---|---|
| CN | 202503137 U | 10/2012 |
| CN | 202872102 U | 4/2013 |

(Continued)

*Primary Examiner* — Phuong Chi Thi Nguyen
(74) *Attorney, Agent, or Firm* — Wei Te Chung; Ming Chieh Chang (57) ABSTRACT

The electrical connector includes an insulative housing for receiving the CPU therein with a plurality of contacts retained thereto, a fastener located beside the housing, and a load plate pivotally mounted upon the fastener and covering the housing for holding the CPU in position. The load plate includes opposite first and second sides and opposite first and fourth sides to commonly form a center opening. The first and second sides form first protrusions with corresponding first pressing sections, and the third and fourth sides forms second protrusions with corresponding second pressing sections. During operation, both the first pressing sections and the second pressing sections act upon the CPU.

15 Claims, 7 Drawing Sheets

(56) References Cited

U.S. PATENT DOCUMENTS

| | | | |
|---|---|---|---|
| 9,214,754 B2* | 12/2015 | Yeh ...................... | H01R 13/516 |
| 9,787,013 B2* | 10/2017 | Sasaki .................... | H01R 12/89 |
| 2005/0287858 A1* | 12/2005 | Toda .................... | H05K 7/1053 |
| | | | 439/331 |

FOREIGN PATENT DOCUMENTS

| | | |
|---|---|---|
| CN | 205104653 U | 3/2016 |
| CN | 205724113 U | 11/2016 |
| CN | 206850134 U | 1/2018 |

* cited by examiner

CONNECTOR EQUIPPED WITH LOAD COVER CONTACTING CPU PERIPHERALLY

BACKGROUND OF THE INVENTION

1. Field of the Invention

The present invention relates generally to an electrical connector, and more particularly to the connector connecting a CPU (Central Processing Unit) to a PCB (Printed Circuit Board).

2. Description of Related Arts

U.S. Pat. Nos. 9,871,332 and 10,038,258 refers to a traditional electrical connector receiving the CPU for connecting to a PCB. Anyhow, because of the high speed and the high frequency of the CPU, the traditional design can no longer satisfy the heat dissipation during operation.

An electrical connector having efficient heat dissipation for removing the heat from the CPU is desired.

SUMMARY OF THE INVENTION

An object of the invention is to provide an electrical connector for connecting a CPU to a PCB. The electrical connector includes an insulative housing for receiving the CPU therein with a plurality of contacts retained thereto, a fastener located beside the housing, and a load plate pivotally mounted upon the fastener and covering the housing for holding the CPU in position. The load plate includes opposite first and second sides and opposite first and fourth sides to commonly form a center opening. The first and second sides form first protrusions with corresponding first pressing sections, and the third and fourth sides forms second protrusions with corresponding second pressing sections. During operation, both the first pressing sections and the second pressing sections act upon the CPU.

The CPU has a central raised portion with step structures on four sides thereof, and the first pressing sections and the second pressing sections abut against the step structures.

DETAILED DESCRIPTION OF THE PREFERRED EMBODIMENT

Figure 1:
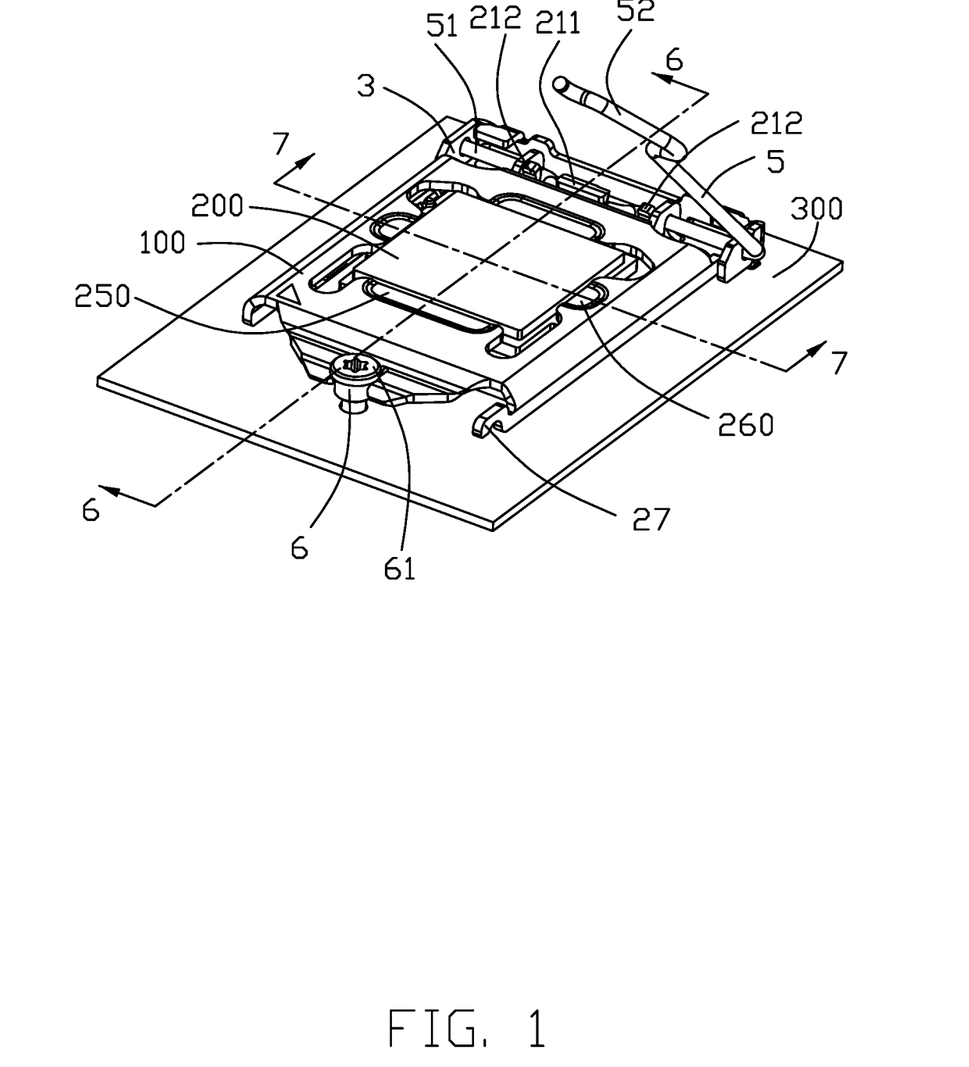
FIG. 1 is a perspective view of an electrical connector assembly according to the invention.
Figure 2:
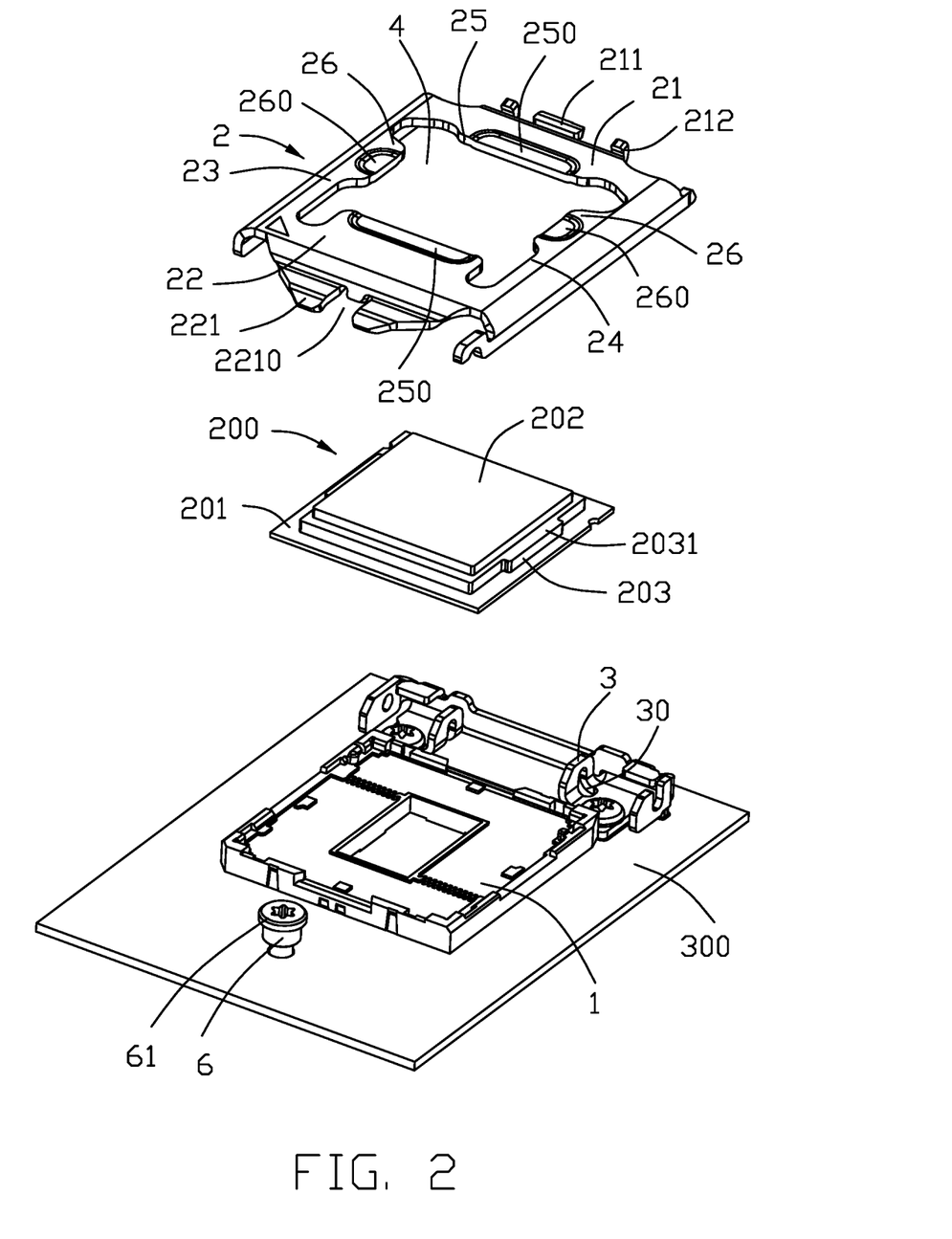
FIG. 2 is an exploded perspective view of the electrical connector assembly of FIG. 1.
Figure 3:
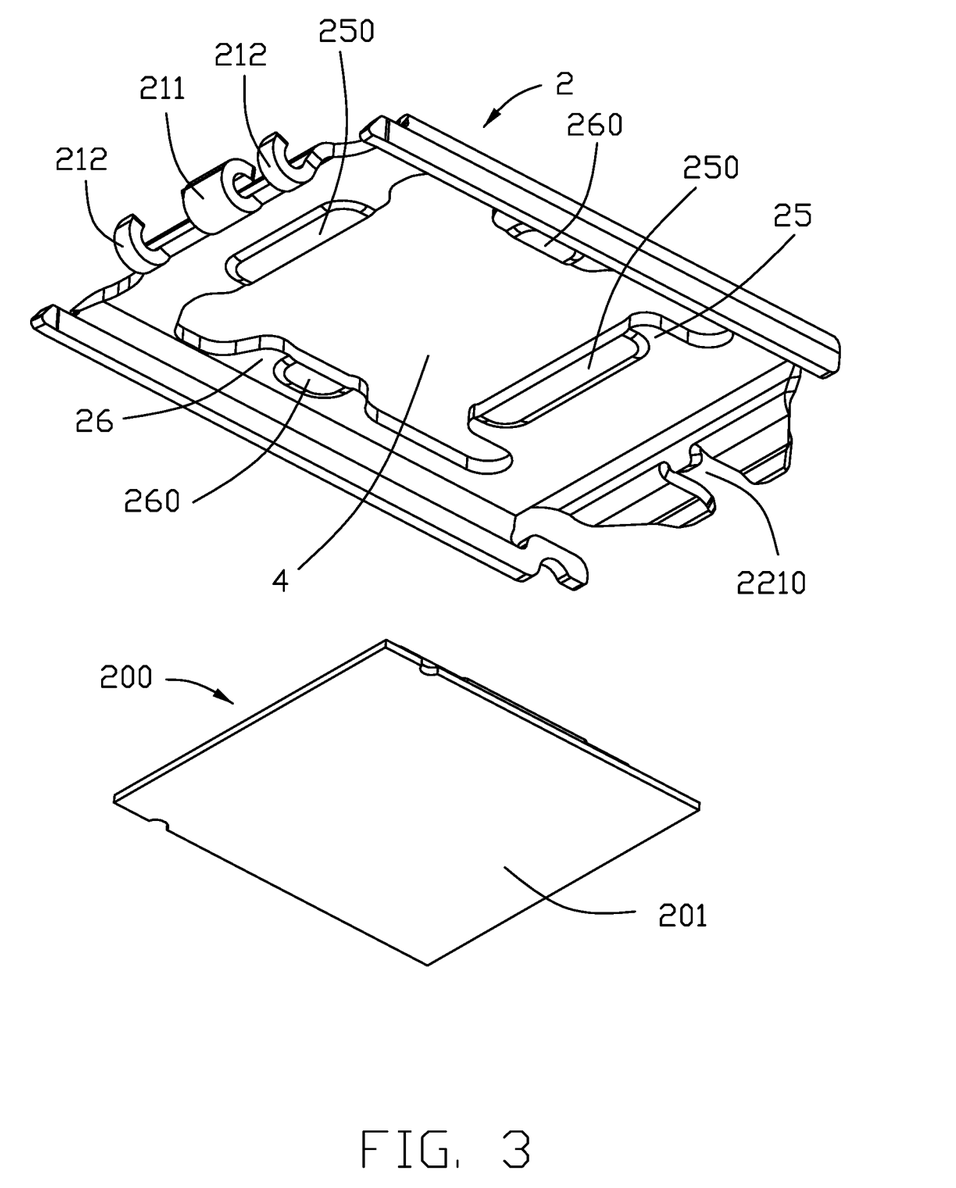
FIG. 3 is an exploded perspective view of the load plate and the CPU of the electrical connector assembly of FIG. 1.
Figure 4:
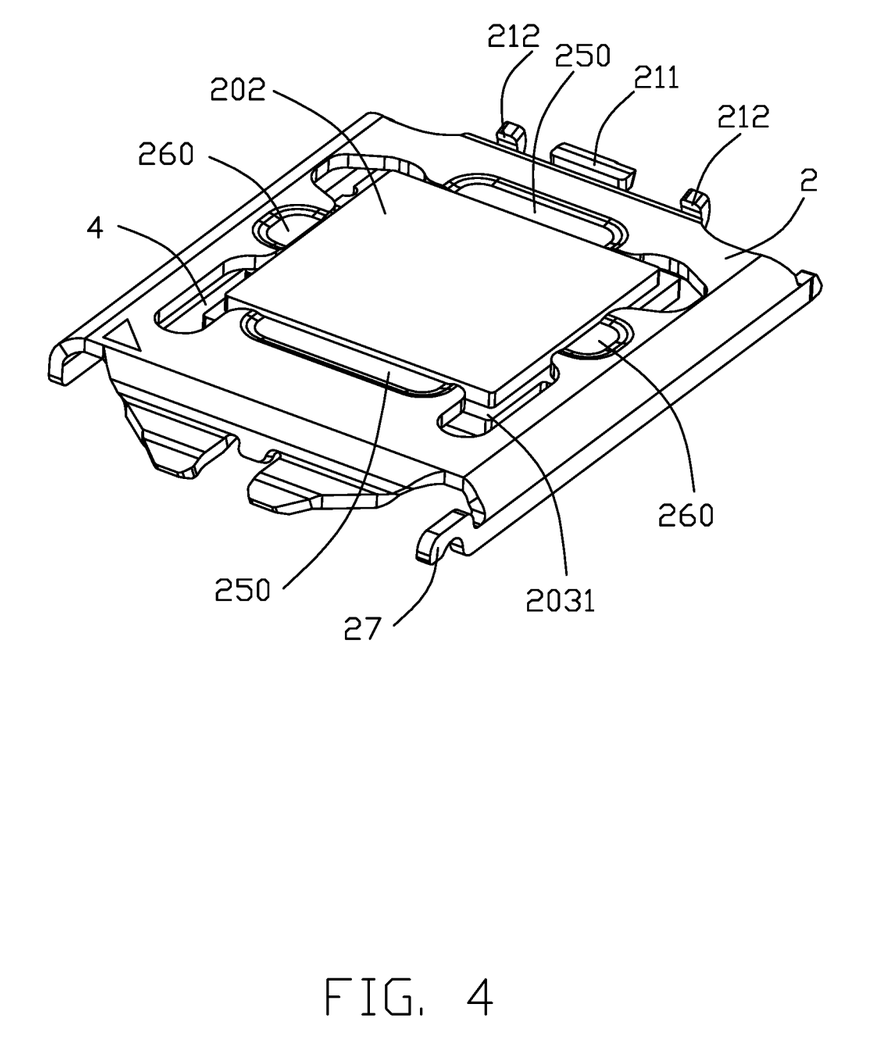
FIG. 4 is a perspective view of the load plate and the CPU of the electrical connector assembly of FIG. 3.
Figure 5:
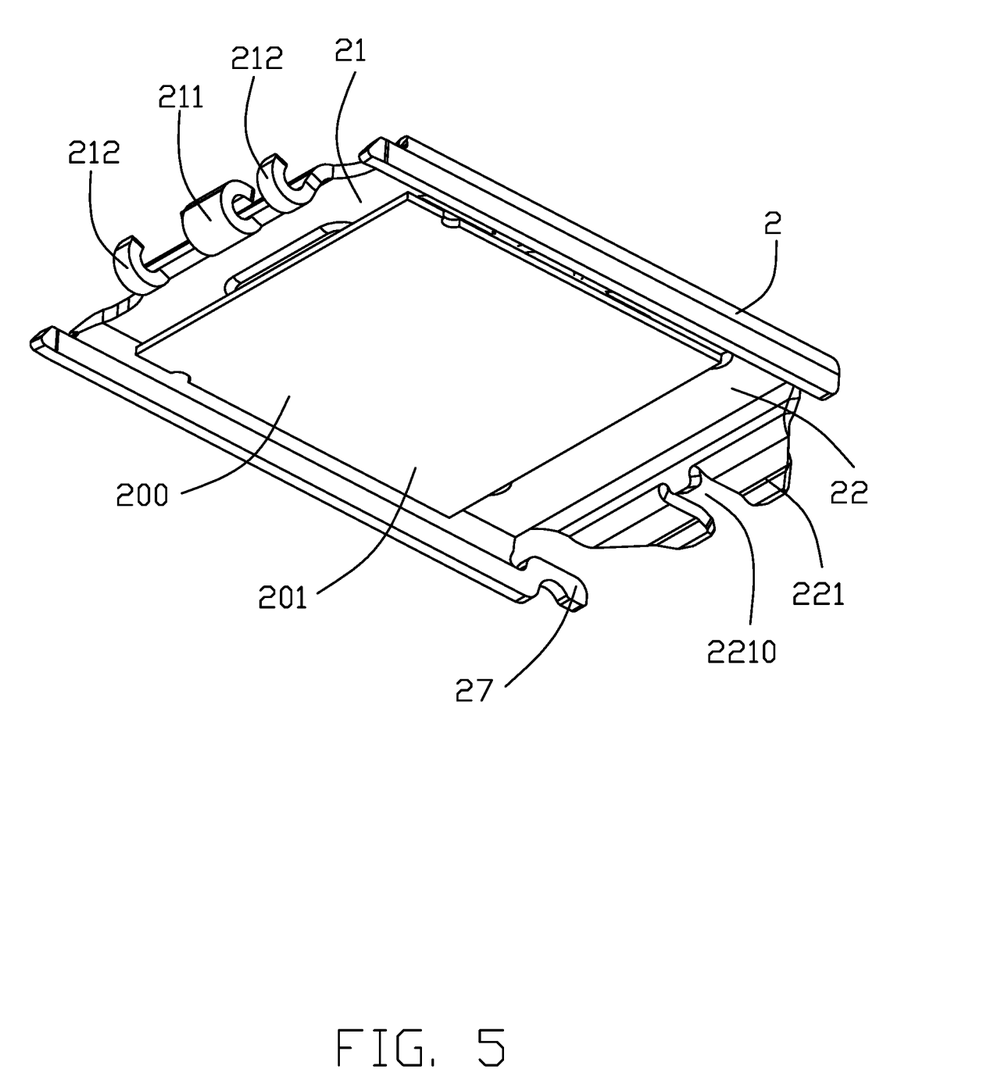
FIG. 5 is another perspective view of the load plate and the CPU of the electrical connector assembly of FIG. 4.
Figure 6:
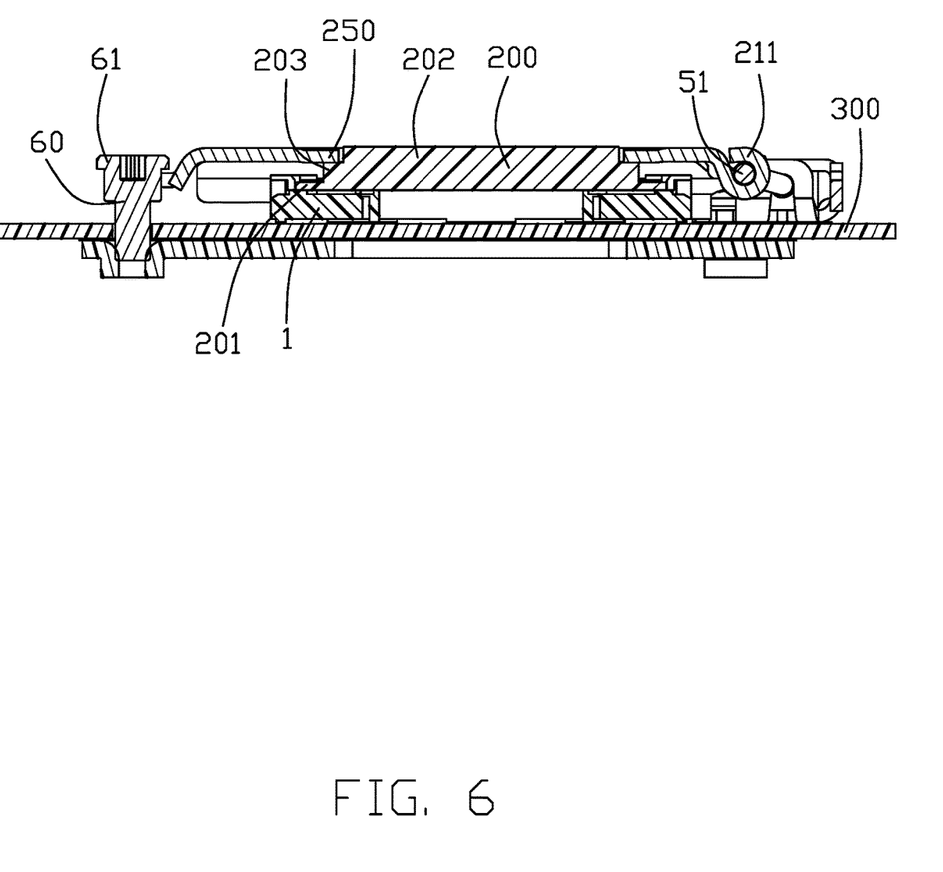
FIG. 6 is a cross-sectional view of the electrical connector assembly of FIG. 1 along line 6-6.
Figure 7:
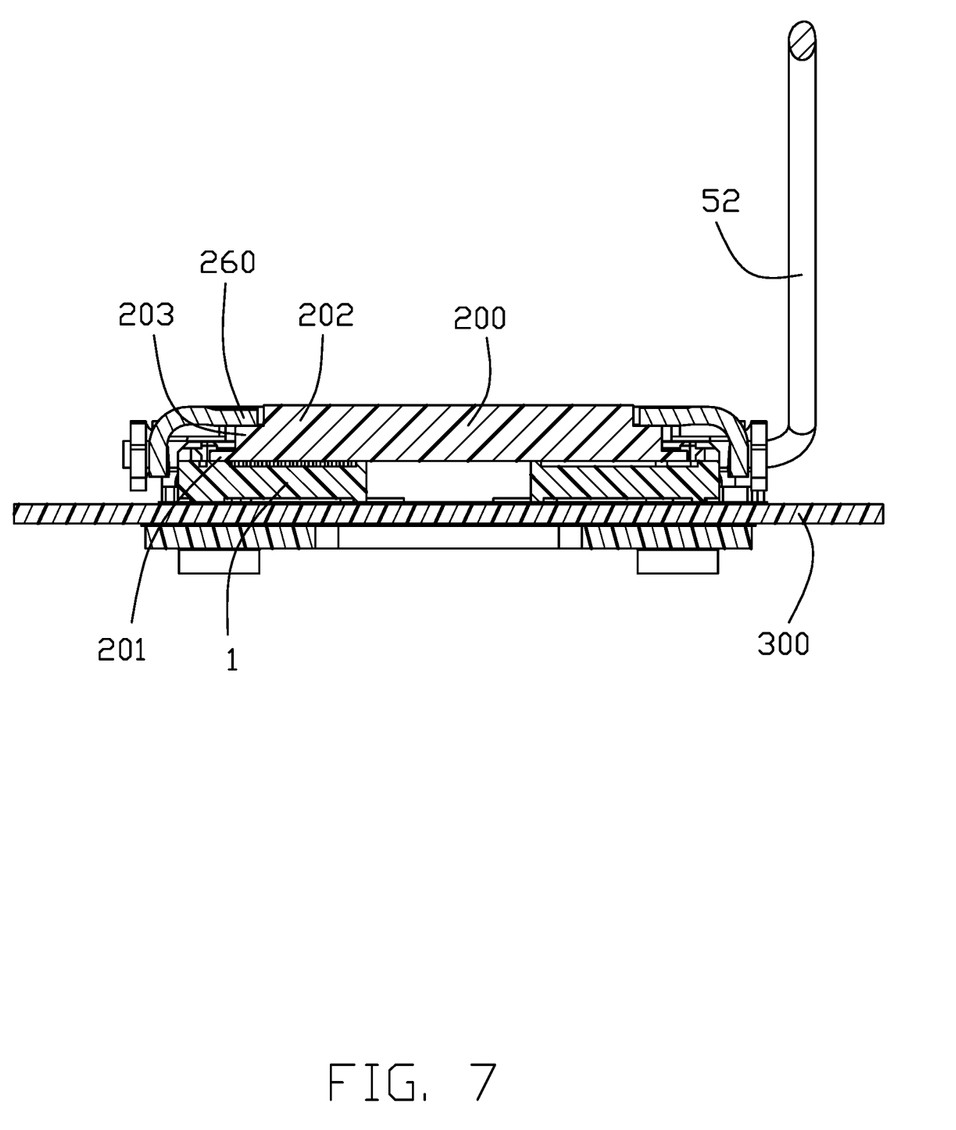
FIG. 7 is another cross-sectional view of the electrical connector assembly of FIG. 1 along line 7-7.

Referring to FIG. 1-7, an electrical connector 100 for connecting a CPU 200 to a PCB 300. The connector 100 includes an insulative housing 1 with a receiving cavity (not labeled) for receiving the CPU 200 therein with a plurality of contacts (not shown) retained thereto, a fastener 3 by a rear end thereof, and a load plate 2 pivotally mounted to the fastener 3 and adapted to cover the housing 1. The load plate 2 includes a first/rear side 21 and a second/front side 22 opposite to each other in the front-to-back direction, and a third/left side 23 and a fourth/right side 24 opposite to each other in a transverse direction perpendicular to the front-to-back direction. The first side 21, the second side 22, the third side 23 and the fourth side 24 commonly define a center opening 4. Each of the first side 21 and the second side 22 has a first protrusion 25 which inwardly protrudes into the center opening 4 in the front-to-back direction, and each of the third side 23 and the fourth side 24 has a second protrusion 26 which inwardly protrudes into the center opening 4 in the transverse direction. Both first protrusion 25 and the second protrusion 26 are of an embossment structure for assuring stiffness thereof. The first protrusion 25 and the second protrusion 26 have the corresponding downwardly protruding first pressing section 250 and the second pressing section 260, respectively, so as to downwardly press the CPU 200 during operation. Notably, the center opening 4 provides space beside the corresponding first protrusions 25 and second protrusions 26 to expedite ventilation.

The CPU 200 includes a base 201 and a center protrusion 202 with a step structure 203 on four sides peripherally. The step structure 203 forms the upward abutment surface 2031 which is lower than the top surface of the center protrusion 201 while above the top surface of the base 201. The first pressing sections 250 and the second pressing sections 206 downwardly press the abutment surface 2031. Notably, because the first protrusion 25 and the second protrusion 26 extends in a cantilevered manner, there is a buffered effect between the load plate 2 and the CPU 200, thus avoiding excessive forces imposed upon the CPU 200. The center protrusion 202 extends through the center opening 4 to abut against a bottom surface of a heat sink (not shown).

In this embodiment, the length of the first protrusion 25 is essentially equal to one half the first/second side 21/22, thus assuring the sufficient contact area between the CPU 200 and the load plate 2 for enhancing heat dissipation. In this embodiment, the width of the first protrusion 25 is larger than that of the second protrusion 26. This arrangement is for compliance with the retention force which is derived from engagement between the load plate 2 and the fixing device 6, and that between the load plate 2 and the lever 5 which is pivotally mounted to the fastener 3 occurring along the centerline of the connector 100 along the front-to-back direction. Understandably, the step structure 2031 on four sides are respectively pressed by the pair of first pressing sections 250 and the pair of second pressing sections 260 so that the whole CPU 200 may experience the forces evenly without tilting tendency.

A first side 21 of the load plate 2 forms a pivotal region 211, and a lever 5 is pivotally mounted to the fastener 3 with an offset section (not labeled) to which the pivotal region 211 is pivotally mounted. Accordingly, the lever 5 may associatively move the load plate 2 to move back and forth when the lever 5 is rotatable about the fastener 3. The fixing device 6 is located at the front end of the housing 1. The second side 22 includes a fixing region 221 to be secured to the fixing device 6. The fastener 3 has the pivot hole 30. The lever 5 includes an actuation bar 51 and a handle 52 perpendicular to the actuation bar 51. The actuation bar 51 extends through both the pivot hole 30 and the pivotal region 211 so as to secured to the load plate 2 to the fastener 3 indirectly in a pivotal manner wherein the offset section (not labeled) of the actuation bar 51 is pivotally received within the pivotal region 211. Therefore, the rear end of the load plate 2 is retained in position by the actuation bar 51 substantially. The first side 21 further includes a pair of abutting sections 212 so as to cooperate with the pivotal region 211 to retain the offset section of the actuation bar 51 of the lever 5.

The fixing device 6 is a screw or a rivet. The fixing region 221 of the load plate 2 has a notch 2210 through while the fixing device 6 extends. The fixing device 6 includes a fixing body 60 and a fixing head 61 which is dimensioned larger than the width of the notch 2210. After assembled, the fixing body 60 is received within the notch 2210, and the fixing region 221 is downwardly pressed under the fixing head 61. The handle 52 is engaged with the locking tab 27 located at front end of the load plate 2. In this situation, the load plate 2 is downwardly pressed by the fixing head 61 at the front end and the offset section of the actuation bar 51 of the lever 5 at the rear end.

In brief, the features of the invention include a pair of first protrusions 25 providing the first pressing sections 250 inwardly protruding into the center opening 4 in the front-to-back direction around the centerline of the connector where the engagement between the lever 5 and the load plate 2 and that between the fixing head 6 and the load plate 2 occur. Therefore, the forces are imposed upon the center region of the rear end of the CPU 200 and that of the front end of the CPU 200 in compliance with the engagements occurring along the centerline of the connector. In addition, a pair of second protrusions 25 providing a pair of second pressing sections 260, inwardly protrude into the center opening 4 in the transverse direction. The cooperation of the first protrusions 25 and the second protrusions 26 result in a four sided abutment against four sides of the CPU in a balanced manner. The width of the first protrusion 25 is dimensioned around one half of the first/second side 21/22 is to enlarge the contact area between the first protrusion 25 and the CPU 200 for enhancing heat dissipation. Simultaneously, the spaces (not labeled) formed among the neighboring protrusions 25 and 26 may enhance ventilation for heat transfer.

What is claimed is:

1. An electrical connector assembly comprising:
   an insulative housing defining a receiving cavity;
   a rectangular CPU (Central Processing Unit) disposed in the receiving cavity and defining four sides;
   a metallic fastener locate by a rear end of the housing;
   a fastening device located by a front end of the housing;
   a load plate having four sides including a front side and a rear side opposite to each other in a front-to-back direction, and a left side and a right side opposite to each other in a transverse direction perpendicular to the front-to-back direction, the front side being adapted to be secured to the fastening device and the rear side pivotally mounted to the fastener;
   a center opening formed among said four sides;
   a pair of first protrusions respectively extending from a middle region of the front side and that of the rear side inwardly toward the center opening in the front-to-back direction; and
   a pair of first pressing sections formed on the corresponding first protrusions to press opposite front and rear sides of the CPU so that engagement between the load plate and occurs around a centerline of the housing extending along the front-to-back direction wherein
   a pair of spaces are located beside each first protrusion in the center opening for ventilation in a vertical direction perpendicular to the front-to-back direction; wherein
   a pair of second protrusions respectively extending from a middle region of the left side and that of the right side inwardly toward the center opening in a transverse direction perpendicular to both the front-to-back direction and the vertical direction;
   further including a lever having an actuation bar pivotally mounted upon the fastener with an offset section to which the rear side is pivotally mounted so as to have the rear side indirectly pivotally mounted to the fastener.

2. The electrical connector assembly as claimed in claim 1, wherein a width of the first protrusion is around one half of the rear side or the front side.

3. The electrical connector assembly as claimed in claim 1, wherein the front side of the load plate forms a locking tab to retain a handle of the lever which is perpendicular to the actuation bar.

4. The electrical connector assembly as claimed in claim 1, wherein a pair of second pressing sections are respectively formed on the pair of second protrusions to downwardly press opposite left and right sides of the CPU.

5. The electrical connector assembly as claimed in claim 4, wherein a width of the first protrusion is larger than that of the second protrusion.

6. The electrical connector assembly as claimed in claim 4, wherein the CPU has a base plate and a center raised protrusion with a four-sided step structure, and the load plate presses all four sides of the step structure.

7. An electrical connector assembly comprising:
   an insulative housing defining a receiving cavity;
   a rectangular CPU (Central Processing Unit) disposed in the receiving cavity and defining four sides;
   a metallic fastener locate by a rear end of the housing;
   a fastening device located by a front end of the housing;
   a load plate having four sides including a front side and a rear side opposite to each other in a front-to-back direction, and a left side and a right side opposite to each other in a transverse direction perpendicular to the front-to-back direction, the front side being adapted to be secured to the fastening device and the rear side pivotally mounted to the fastener; and
   a center opening formed among said four sides; wherein
   the load plate forms four downwardly extending pressing sections respectively upon said front side, the rear side, the left side and the right to press opposite front and rear sides and opposite left and right sides of the CPU, respectively;
   wherein
   each of said pressing sections is formed on a corresponding protrusion on the corresponding one of said front side, said rear side, said left side and said right side, and said protrusion extends inwardly toward the center opening;
   further including a lever having an actuation bar pivotally mounted to the fastener with an offset section to which the load plate is pivotally mounted so as to have the load plate indirectly pivotally mounted to the fastener.

8. The electrical connector assembly as claimed in claim 7, wherein widths of the pressing sections on the front side and the rear side are larger than those on the left side and the right side.

9. The electrical connector assembly as claimed in claim 7, wherein each protrusion is located at a middle region of the corresponding one of said front side, said rear side, said left side and said right side.

10. The electrical connector assembly as claimed in claim 7, wherein a pair of spaces are formed by two sides of each protrusion in said center opening.

11. The electrical connector assembly as claimed in claim 7, wherein each of said four pressing sections is located at a middle region of the corresponding one of said front side, said rear side, said left side and said right side.

12. A metallic load plate for use within an electrical connector having opposite metallic fastener and fastening device, and a metallic lever pivotally mounted to the fastener, and a CPU (Central Processing Unit) received within the electrical connector, comprising:
- a front side and a rear side opposite to each other in a front-to-back direction;
- a left side and a right side opposite to each other in a transverse direction perpendicular to the front-to-back direction;
- a center opening formed among the front side, the rear side, the left side and the right side;
- a pair of first protrusions formed on the opposite front and rear sides with a pair of downwardly extending first pressing sections, respectively;
- a pair of second protrusions formed on the opposite left and right sides with a pair of downwardly extending second pressing sections, respectively; wherein
- the rear side is configured to be pivotally mounted to the lever, the front side is configured to be downwardly pressed by the fastening device so as to apply a balanced four-sided force upon the CPU; wherein
- each of said first or second pressing sections is formed on the corresponding first or second protrusion on the corresponding one of said front side, said rear side, said left side and said right side, and said first or second protrusion extends inwardly toward the center opening;
- further including a lever having an actuation bar pivotally mounted to the fastener with an offset section to which the load plate is pivotally mounted so as to have the load plate indirectly pivotally mounted to the fastener.

13. The load plate as claimed in claim 12, wherein each of the first protrusion is located at a middle region of the corresponding one of the front side and the rear side, and each of the second protrusion is located at a middle region of the corresponding one of the left side and the right side.

14. The load plate as claimed in claim 13, wherein in the center opening, a pair of spaces are formed by two sides of each of the first protrusions, and a pair of spaces are formed by two sides of each of the second protrusion.

15. The load plate as claimed in claim 14, wherein a width of the first protrusion is larger than that of the second protrusion.

* * * * *